(12) United States Patent
Besling

(10) Patent No.: US 10,743,112 B2
(45) Date of Patent: Aug. 11, 2020

(54) MICROPHONE AND PRESSURE SENSOR PACKAGE AND METHOD OF PRODUCING THE MICROPHONE AND PRESSURE SENSOR PACKAGE

(71) Applicant: Sciosense B.V., AE Eindhoven (NL)

(72) Inventor: Willem Frederik Adrianus Besling, Eindhoven (NL)

(73) Assignee: SCIOSENSE B.V., AE Eindhoven (NL)

( * ) Notice: Subject to any disclaimer, the term of this patent is extended or adjusted under 35 U.S.C. 154(b) by 0 days.

(21) Appl. No.: 16/312,058

(22) PCT Filed: Jun. 14, 2017

(86) PCT No.: PCT/EP2017/064630
§ 371 (c)(1),
(2) Date: Dec. 20, 2018

(87) PCT Pub. No.: WO2017/220419
PCT Pub. Date: Dec. 28, 2017

(65) Prior Publication Data
US 2019/0208331 A1    Jul. 4, 2019

(30) Foreign Application Priority Data
Jun. 21, 2016   (EP) .................................... 16175477

(51) Int. Cl.
*H04R 19/04*   (2006.01)
*B81B 7/00*   (2006.01)
(Continued)

(52) U.S. Cl.
CPC ........... *H04R 19/04* (2013.01); *B81B 7/0048* (2013.01); *B81B 7/0061* (2013.01);
(Continued)

(58) Field of Classification Search
CPC ........ H04R 19/04; H04R 19/005; H04R 1/04; H04R 31/003; B81B 7/0048;
(Continued)

(56) References Cited

U.S. PATENT DOCUMENTS 6,012,336 A    1/2000  Eaton et al.
8,659,100 B2   2/2014  Zoellin et al.
(Continued)

FOREIGN PATENT DOCUMENTS

CN    102685657 A    9/2012
CN    104902411 A    9/2015
(Continued)

OTHER PUBLICATIONS

European Patent Office, International Search Report for PCT/EP2017/064630 dated Aug. 21, 2017.
(Continued)

*Primary Examiner* — William A Jerez Lora
(74) *Attorney, Agent, or Firm* — Slater Matsil, LLP

(57) ABSTRACT

The microphone and pressure sensor package comprises a carrier (1) with an opening (16), a microphone device (20) including a diaphragm (21) and a perforated back plate (22) arranged above the opening (16), an ASIC device (6), and a cover (9) forming a cavity (17) between the carrier (1) and the cover (9). The ASIC device (6) and the microphone device (20) are arranged in the cavity (17). A sensor element (7) provided for a pressure sensor is integrated in the ASIC device (6). The pressure outside the cavity (17) is transferred to the sensor element (7) through the opening (16), the diaphragm (21), and the back plate (22).

19 Claims, 4 Drawing Sheets

(51) Int. Cl.
  *H04R 1/04* (2006.01)
  *H04R 19/00* (2006.01)
  *B81B 7/02* (2006.01)
  *B81C 1/00* (2006.01)
  *H01L 23/00* (2006.01)
  *H04R 31/00* (2006.01)

(52) U.S. Cl.
  CPC ............. *B81B 7/0064* (2013.01); *B81B 7/02* (2013.01); *B81C 1/00309* (2013.01); *B81C 1/00325* (2013.01); *H01L 24/16* (2013.01); *H01L 24/32* (2013.01); *H01L 24/48* (2013.01); *H01L 24/73* (2013.01); *H04R 1/04* (2013.01); *H04R 19/005* (2013.01); *H04R 31/003* (2013.01); *B81B 2201/0257* (2013.01); *B81B 2201/0264* (2013.01); *B81B 2203/0127* (2013.01); *B81B 2207/012* (2013.01); *B81B 2207/07* (2013.01); *B81C 2203/0792* (2013.01); *H01L 2224/16227* (2013.01); *H01L 2224/32145* (2013.01); *H01L 2224/48137* (2013.01); *H01L 2224/48139* (2013.01); *H01L 2224/48227* (2013.01); *H01L 2224/73265* (2013.01); *H01L 2924/00014* (2013.01); *H01L 2924/1433* (2013.01); *H01L 2924/1461* (2013.01); *H01L 2924/3025* (2013.01)

(58) Field of Classification Search
  CPC ....... B81B 7/0061; B81B 7/0064; B81B 7/02; B81B 2201/0257; B81B 2201/0264; B81B 2203/0127; B81B 2207/012; B81B 2207/07; B81C 1/00309; B81C 1/00325; B81C 2203/0792; H01L 2924/00014; H01L 2924/1433; H01L 2924/1461; H01L 2924/3025; H01L 2224/16227; H01L 2224/32145; H01L 2224/48137; H01L 2224/48139; H01L 2224/48227; H01L 2224/73265; H01L 24/16; H01L 24/32; H01L 24/48; H01L 24/71

USPC ......... 381/71.2, 91, 94.7, 95, 113, 122, 175, 381/302, 355, 375
See application file for complete search history.

(56) References Cited

U.S. PATENT DOCUMENTS

| | | | |
|---|---|---|---|
| 2005/0280138 | A1* | 12/2005 | Shrivastava ........ H01L 23/4985 257/697 |
| 2010/0224945 | A1 | 9/2010 | Takahata et al. |
| 2013/0264610 | A1* | 10/2013 | Chen ...................... B81C 1/0023 257/252 |
| 2013/0285165 | A1* | 10/2013 | Classen ............... B81C 1/00238 257/415 |
| 2014/0191233 | A1* | 7/2014 | Gehl ......................... B81B 7/02 257/48 |
| 2015/0256917 | A1 | 9/2015 | Schelling et al. |
| 2015/0259194 | A1* | 9/2015 | Lin .......................... B81B 7/007 257/773 |
| 2016/0142829 | A1 | 5/2016 | Berger et al. |
| 2016/0169758 | A1 | 6/2016 | Hooper et al. |
| 2017/0230758 | A1* | 8/2017 | Kuntzman ............. H04R 19/04 |
| 2017/0334714 | A1* | 11/2017 | Gao ........................ B81B 7/02 |
| 2017/0347174 | A1* | 11/2017 | Chandrasekaran ....... B81B 7/02 |

FOREIGN PATENT DOCUMENTS

| | | |
|---|---|---|
| DE | 102014106220 | 11/2015 |
| WO | 2002/48668 | 6/2002 |

OTHER PUBLICATIONS

Office Action issued in European Application No. 16175477.5, dated Jan. 9, 2020, 6 pages.

Chinese National Intellectual Property Administration (CNIPA) English translation of Office Action issued in Appl. No. 201780038156.0, dated Mar. 19, 2020, 9 pages.

* cited by examiner

MICROPHONE AND PRESSURE SENSOR PACKAGE AND METHOD OF PRODUCING THE MICROPHONE AND PRESSURE SENSOR PACKAGE

BACKGROUND OF THE INVENTION

The present invention relates to a compact package suitable for an integration of a pressure sensor for the detection of the ambient average pressure and a microelectromechanical system used as a microphone for the detection of fast pressure variations like sound waves. The package allows a mechanical decoupling of the pressure sensor from stress caused by external forces acting on the package.

WO 2002/048668 A2 discloses an integrated CMOS capacitive pressure sensor.

US 2016/0142829 A1 discloses an MEMS microphone including a package substrate having a port disposed through the package substrate, wherein the port is configured to receive acoustic waves; a lid mounted to the package substrate and forming a package. The MEMS microphone also includes an acoustic sensor disposed in the package and coupled to the package substrate, wherein the MEMS acoustic sensor is positioned such that the acoustic waves receivable at the port are incident on the MEMS acoustic sensor. The MEMS acoustic sensor includes: a back plate positioned over the port at a first location within the package; and a diaphragm positioned at a second location within the package, wherein a distance between the first location and the second location forms a defined sense gap, and wherein the MEMS microphone is designed to withstand a bias voltage between the diaphragm and the back plate greater than or equal to about 15 volts.

SUMMARY OF THE INVENTION

The microphone and pressure sensor package comprises a carrier with an opening, a microphone device including a diaphragm and a perforated back plate arranged above the opening, an ASIC device and a cover forming a cavity between the carrier and the cover. The ASIC device and the microphone device are arranged in the cavity. A sensor element provided for a pressure sensor is integrated, in particular monolithically integrated, in the ASIC device. The pressure that is present outside the cavity is transferred to the sensor element through the opening, the diaphragm, and the back plate. The package may thus comprise only two semiconductor dies or chips to include ASIC, sensor element and microphone.

In an embodiment of the microphone and pressure sensor package the ASIC device is mounted on the carrier by an adhesive layer.

A further embodiment of the microphone and pressure sensor package comprises a bottom device, which may especially comprise an insulator or glass, or a semiconductor material. The bottom device is fastened between the carrier and the ASIC device. The bottom device may especially include an electrically inactive semiconductor substrate.

In a further embodiment the bottom device includes a further ASIC device electrically connected with the microphone device.

A further embodiment comprises an adhesive layer comprising silicone between the bottom device and the ASIC device.

In a further embodiment the ASIC device laterally overhangs the bottom device by at least 100 μm.

In a further embodiment the ASIC device is electrically connected with the microphone device. In particular, the ASIC device can be provided for a read-out of the sensor element and the microphone device.

A further embodiment comprises electric conductors arranged in the carrier, and the ASIC device is electrically connected with the electric conductors.

In a further embodiment the microphone device is electrically connected with the electric conductors.

In a further embodiment the ASIC device is mounted to the carrier in a flip-chip technology.

A further embodiment comprises a hole or a plurality of holes penetrating the diaphragm.

The method of producing a microphone and pressure sensor package comprises providing a carrier with an opening, arranging a microphone device including a diaphragm and a perforated back plate above the opening, providing an ASIC device with an integrated sensor element provided for a pressure sensor, fastening the ASIC device on the carrier, and applying a cover to the carrier, so that the cover forms a cavity between the carrier and the cover, and the ASIC device and the microphone device are arranged in the cavity.

In a variant of the method, a bottom device is fastened between the carrier and the ASIC device.

In a further variant of the method, an adhesive layer comprising silicone is arranged between the bottom device and the ASIC device.

In a further variant of the method, the carrier is provided with electric conductors, and at least one of the microphone, bottom and ASIC devices is electrically connected with the electric conductors.

In a further variant of the method, electric connections comprising bond wires are formed, the electric connections electrically connecting at least one of the microphone, bottom and ASIC devices.

In a further variant of the method, the diaphragm is provided with a hole or a plurality of holes penetrating the diaphragm, in particular to allow a low-pass filter function.

The following is a detailed description of examples of the microphone and pressure sensor package and the method of production in conjunction with the appended figures.

DETAILED DESCRIPTION

Figure 1:
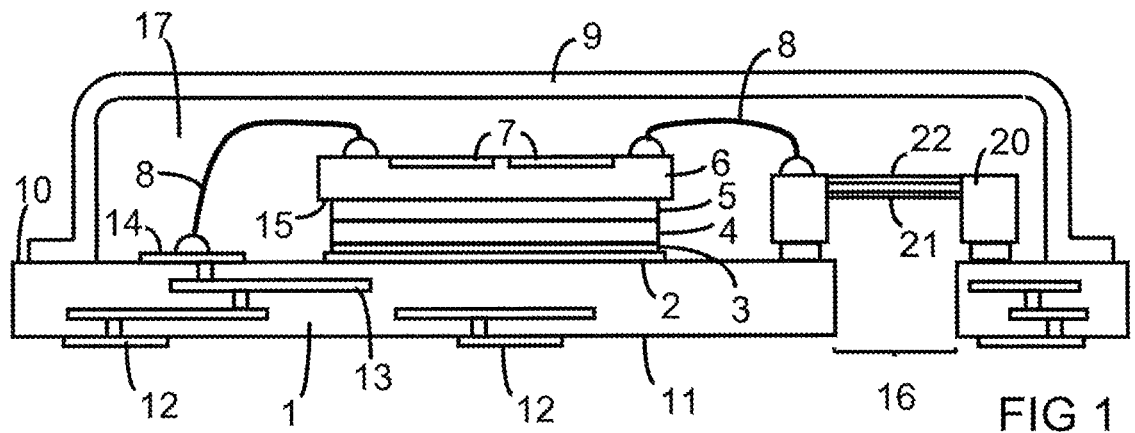
FIG. 1 is a cross section of a microphone and pressure sensor package with an ASIC device on a bottom device.

FIG. 1 is a cross section of a microphone and pressure sensor package comprising a carrier 1 with an opening 16 and optional integrated electric conductors 13. An optional stack includes a bottom pad 2 on a top surface 10 of the carrier 1, a bond layer 3 on the bottom pad 2, and a bottom device 4 on the bond layer 3. An adhesive layer 5 is applied on the bottom device 4. The adhesive layer 5 may instead be applied directly on the top surface 10 of the carrier 1. An ASIC device 6 with an integrated, in particular monolithically integrated, sensor element 7 or array of sensor elements 7 is arranged on the adhesive layer 5. A microphone device 20 comprising a diaphragm 21 and a back plate 22 is arranged above the opening 16. Electric connections 8 are provided between the ASIC device 6 and contact pads 14 on the top surface 10 of the carrier 1 and between the ASIC device 6 and the microphone device 20. A cover 9 is applied on the top surface 10, so that a cavity 17 is formed between the carrier 1 and the cover 9. The ASIC device 6 and the microphone device 20 are accommodated in the cavity 17. It may suffice if only the ASIC device 6 and the microphone device 20 are present in the package as semiconductor dies or chips including active components. Terminal contacts 12 for external electric connections may be formed on the rear surface 11 of the carrier 1, opposite the top surface 10. The terminal contacts 12 are connected to the integrated electric conductors 13.

The carrier 1 may be a printed circuit board, for instance, in particular a laminate. The terminal contacts 12 on the rear surface 11 of the carrier 1 may be formed in the shape of a land grid array, for instance. The integrated electric conductors 13 may provide a wiring or redistribution. The bottom device 4 may comprise semiconductor material, which may in particular be silicon.

The bottom device 4 can especially be used for mechanical decoupling of the ASIC device 6 from the carrier 1. In this case, the bottom device 4 may be an insulator or glass material or a semiconductor material, for instance. The coefficient of thermal expansion of the bottom device 4 can be matched to the coefficient of thermal expansion of the ASIC device 6. The bottom device 4 may especially include an electrically inactive semiconductor substrate, a dummy die or interposer. Deformations that may be caused by external forces acting on the microphone and pressure sensor package may thus be prevented from adversely affecting the sensor element 7 or array of sensor elements 7 integrated in the ASIC device 6. The bottom device 4 may instead be a further ASIC device.

The optional bottom pad 2 may be provided for electrical and/or for shielding purposes. A shield can also be integrated in the carrier 1, especially if the carrier 1 is a multilayered carrier. The bottom pad 2 may be especially advantageous if the bottom device 4 is fastened using a flip-chip technology. In this case the bond layer 3 may be a conventional bonding or solder layer. The bond layer 3 may instead be a die attach foil, for instance.

The adhesive layer 5 may especially comprise silicone, i.e. a compound obtained by polymerizing siloxane. The silicone may be applied like a glue to fasten the ASIC device 6 to the bottom device 4 or directly to the top surface 10 of the carrier 1. The mechanical decoupling of the ASIC device 6 from the bottom device 4 may be enhanced by selecting an appropriate thickness of the adhesive layer 5.

The ASIC device 6 may be a CMOS device, for instance. The sensor element 7 may be any conventional pressure sensor or array of pressure sensors, which may be realized as a microelectromechanical system, for instance. The pressure sensor may particularly be provided for capacitive or piezo-resistive read-out. The ASIC device 6 may especially be provided for the read-out of the sensor element 7. The ASIC device 6 may also be provided for the read-out of the microphone device 20, in particular for the read-out of both the sensor element 7 and the microphone device 20.

The mechanical decoupling of the ASIC device 6 from the carrier 1 is improved if the ASIC device 6 has larger lateral dimensions than the bottom device 4, so that a lateral overhang 15 may be formed at least on one lateral side or edge of the ASIC device 6. The overhang 15 may be considerably larger than the overhang 15 shown in FIG. 1. The electric connections 8 between the ASIC device 6 and contact pads 14 on the top surface 10 of the carrier 1, inside the cavity 17, may be bond wires, for instance, as shown in FIG. 1.

The microphone device 20 may be a microelectromechanical system, for instance. The microphone device 20 has a membrane or diaphragm 21, which is exposed to an ambient medium, in particular ambient air, for example. Pressure variations like sound waves generate corresponding vibrations of the diaphragm 21. The back plate 22 may provide a mechanical support of the microphone device 20. If the back plate 22 is electrically conductive, especially comprising a metal or semiconductor material, and the diaphragm 21 is electrically conductive, the back plate 22 can be used as an electrode for a measurement of the capacitance between the diaphragm 21 and the back plate 22. The capacitance varies according to the vibrations of the diaphragm 21. The variations of the capacitance can hence be evaluated to compute the frequency of the vibrations. The vibrations of the diaphragm 21 are detected and evaluated by an integrated circuit. The circuit may be integrated in the microphone device 20, in the ASIC device 6, or partially in the microphone device 20 and in the ASIC device 6. The electric interconnections 8 between the ASIC device 6 and the microphone device 20 may be bond wires, for instance, as shown in FIG. 1.

The cover 9 may comprise a metal lid. Microphone packages generally require a certain back volume that is completely sealed from the environment. Therefore the cover 9 may hermetically seal the cavity 17.

The diaphragm 21 may be exposed to the environment or ambient medium through the opening 16, as shown in FIG. 1. The diaphragm 21 is penetrated by an opening comprising at least one small hole 25 or channel to equilibrate the pressure between the cavity 17 and the environment. The opening of the diaphragm 21 is sufficiently small, so that the function and sensitivity of the microphone is not adversely affected. The pressure relaxation between the cavity 17 and the environment is at a timescale longer than a frequency of a sound wave. For very fast pressure pulses the opening in the diaphragm 21 will start to function as a low-pass filter that can be used to filter out unwanted signals. In particular, a proper dimensioning of the opening allows to filter out physical disturbances such as pressure pulse due to slamming of a door.

The back plate 22 is typically provided with holes or channels, which give access to the cavity 17, and may especially be heavily perforated to avoid any displacement by pressure variations. The arrangement of the diaphragm 21 and the back plate 22 may be reversed. In this case channels or perforations in the back plate 22 give access to the diaphragm 21.

Figure 2:
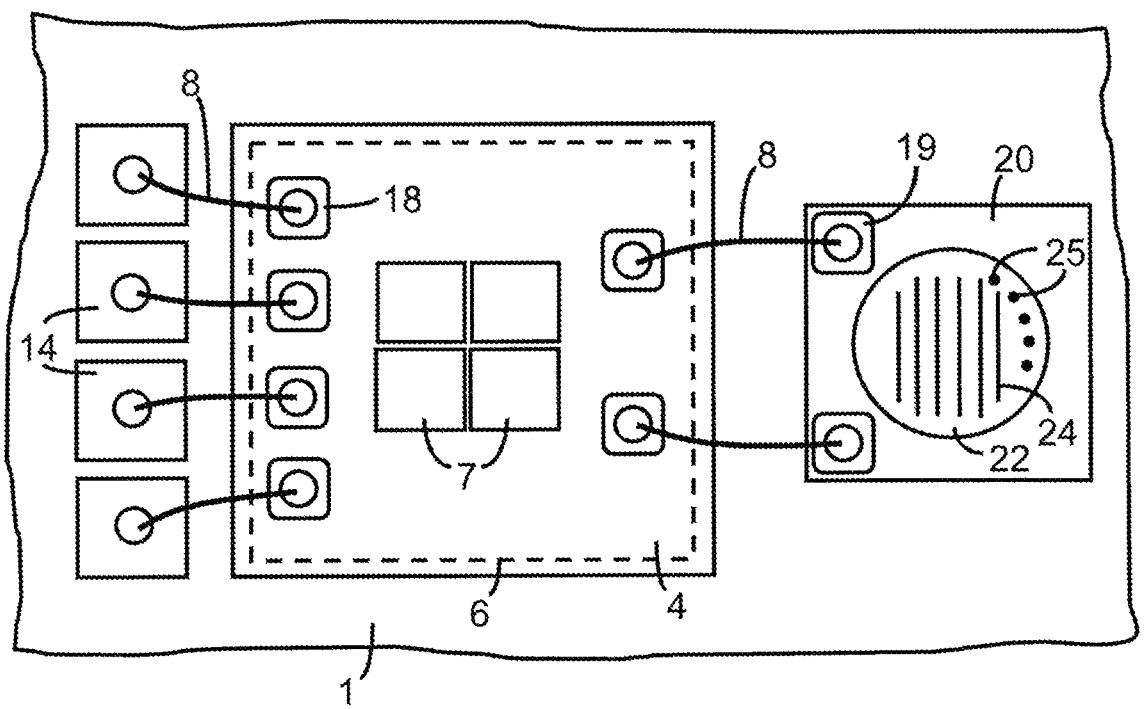
FIG. 2 is a top view of the interior parts of the microphone and pressure sensor package according to FIG. 1.

FIG. 2 is a top view of the interior parts of the microphone and pressure sensor package according to FIG. 1. The electric connections 8 are applied on the contact pads 14 on the top surface 10 of the carrier 1 and on contact areas 18 of the ASIC device 6 and further contact areas 19 of the microphone device 20. The contact areas 18, 19 may be contact pads or uncovered surface areas of an uppermost metallization level of a wiring, for instance. The electric connections 8 are bond wires in this example. The number and the arrangement of the contact pads 14 and contact areas 18, 19 can be varied according to individual requirements. The sensor element 7 or array of sensor elements 7 may be arranged at or near the center of the ASIC device 6, as shown in FIG. 2 by way of example, or near the periphery of the ASIC device 6. Channels or perforations 24 of the back plate 22 and the positions of small holes 25 of the diaphragm 21 are schematically indicated in FIG. 2.

Figure 3:
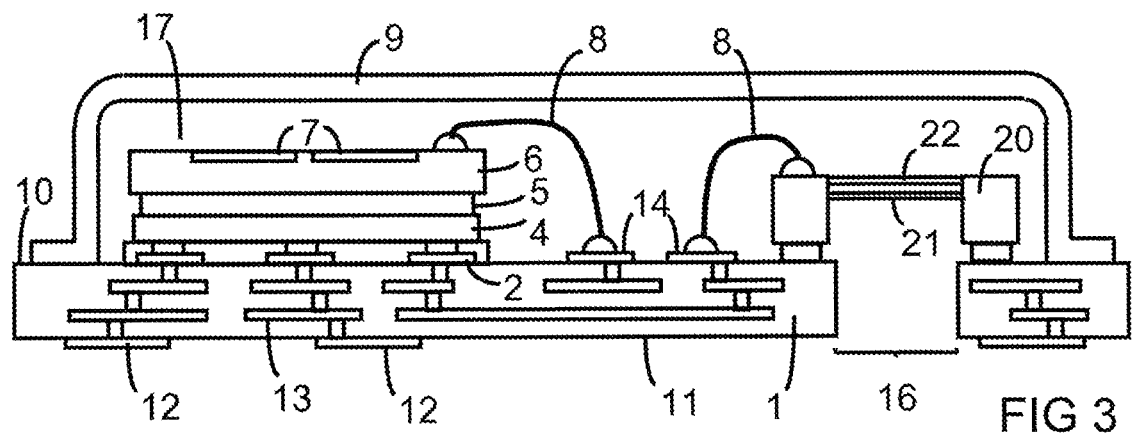
FIG. 3 is a cross section according to FIG. 1 for a further microphone and pressure sensor package with different connections.

FIG. 3 is a cross section according to FIG. 1 for a further microphone and pressure sensor package with different connections. Elements of the microphone and pressure sensor package according to FIG. 3 that are similar to corresponding elements of the microphone and pressure sensor package according to FIG. 1 are designated with the same reference numerals. In the microphone and pressure sensor package according to FIG. 3, the optional bottom device 4 is fastened to a plurality of bottom pads 2 in flip-chip technology. The bottom device 4 may be a further ASIC device, which may thus be electrically connected to the electric conductors 13 integrated in the carrier 1. Instead, the bottom device 4 may be a dummy die or interposer fastened in a similar way. In the example shown in FIG. 3, the electric connections 8 are provided by bond wires connecting the contact areas of both the ASIC device 6 and the microphone device 20 with contact pads 14 on the top surface 10 of the carrier 1. Thus the electric connections between the ASIC device 6 and the microphone device 20 are provided via the electric conductors 13 integrated in the carrier 1. Instead, the electric connections between the ASIC device 6 and the microphone device 20 may be provided as shown in FIG. 1. It may suffice if only these two devices are present in the microphone and pressure sensor package as two semiconductor dies or chips including active components.

Figure 4:
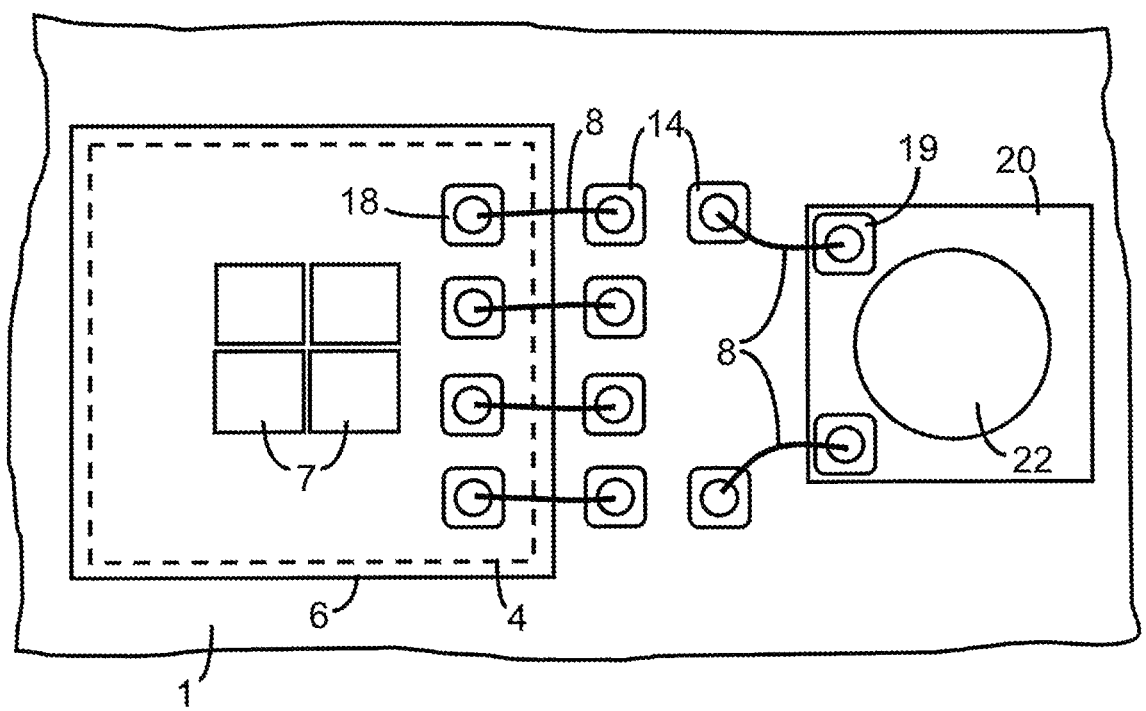
FIG. 4 is a top view of the interior parts of the microphone and pressure sensor package according to FIG. 3.

FIG. 4 is a top view of the interior parts of the microphone and pressure sensor package according to FIG. 3. The electric connections 8, which are bond wires in this example, electrically connect contact areas 18 of the ASIC device 6 with contact pads 14 on the top surface 10 of the carrier 1, and further contact areas 19 of the microphone device 20 with further contact pads 14 on the top surface 10 of the carrier 1. The contact areas 18, 19 may be contact pads or uncovered surface areas of an uppermost metallization level of a wiring, for instance. The number and the arrangement of the contact pads 14 and contact areas 18, 19 can be varied according to individual requirements. The sensor element 7 or array of sensor elements 7 may be arranged at or near the center of the ASIC device 6, as shown in FIG. 4 by way of example, or near the periphery of the ASIC device 6.

Figure 5:
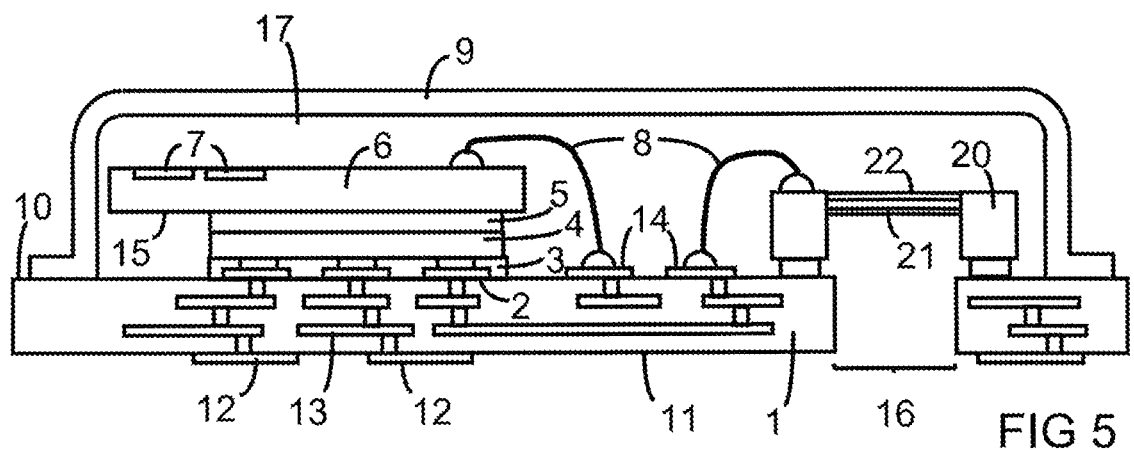
FIG. 5 is a cross section according to FIG. 1 for a further microphone and pressure sensor package comprising an overhang of the ASIC device.

FIG. 5 is a cross section according to FIG. 3 for a further microphone and pressure sensor package comprising a larger overhang 15 of the ASIC device 6. Elements of the microphone and pressure sensor package according to FIG. 5 that are similar to corresponding elements of the microphone and pressure sensor package according to FIG. 3 are designated with the same reference numerals. In the microphone and pressure sensor package according to FIG. 5, the relatively large overhang 15 allows the sensor element 7 or array of sensor elements 7 to be shifted towards a portion of the ASIC device 6 that is not supported by the stack including the optional bottom device 4. The mechanical decoupling of the sensor element 7 or array of sensor elements 7 from the carrier 1 can be enhanced by such an arrangement.

Figure 6:
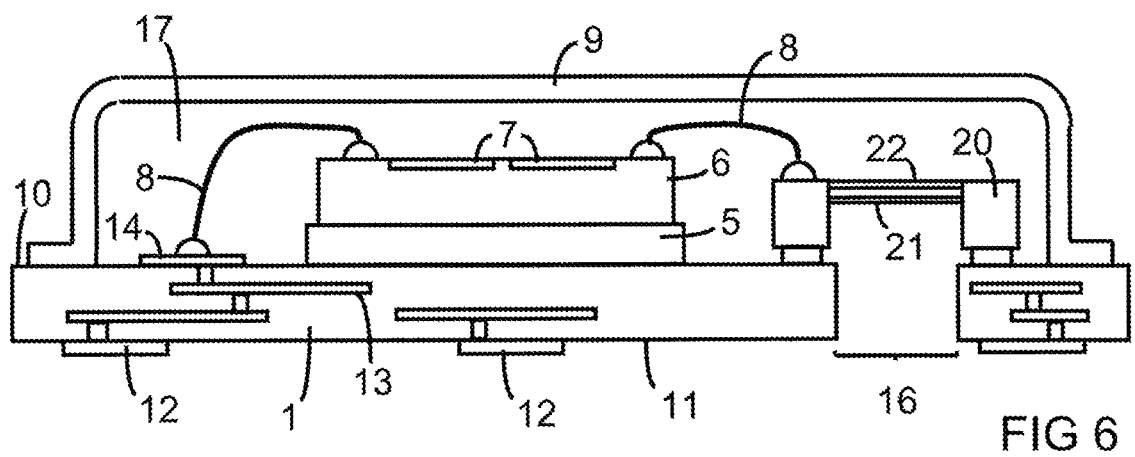
FIG. 6 is a cross section according to FIG. 1 for a further microphone and pressure sensor package without bottom device.

FIG. 6 is a cross section according to FIG. 1 for a further microphone and pressure sensor package without bottom device. Elements of the microphone and pressure sensor package according to FIG. 1 that are similar to corresponding elements of the microphone and pressure sensor package according to FIG. 6 are designated with the same reference numerals. In the microphone and pressure sensor package according to FIG. 6, no bottom device is present under the ASIC device 6. The adhesive layer 5, which may be a silicone, for instance, is directly applied on the top surface 10 of the carrier 1 inside the cavity 17. The mechanical decoupling of the ASIC device 6 from the carrier 1 is enhanced if the adhesive layer 5 is sufficiently thick. In this respect, it may be favorable if the thickness of the adhesive layer 5 is larger than 80 µm. Furthermore, it may be favorable if the thickness of the ASIC device 6 is larger than about 300 µm.

Figure 7:
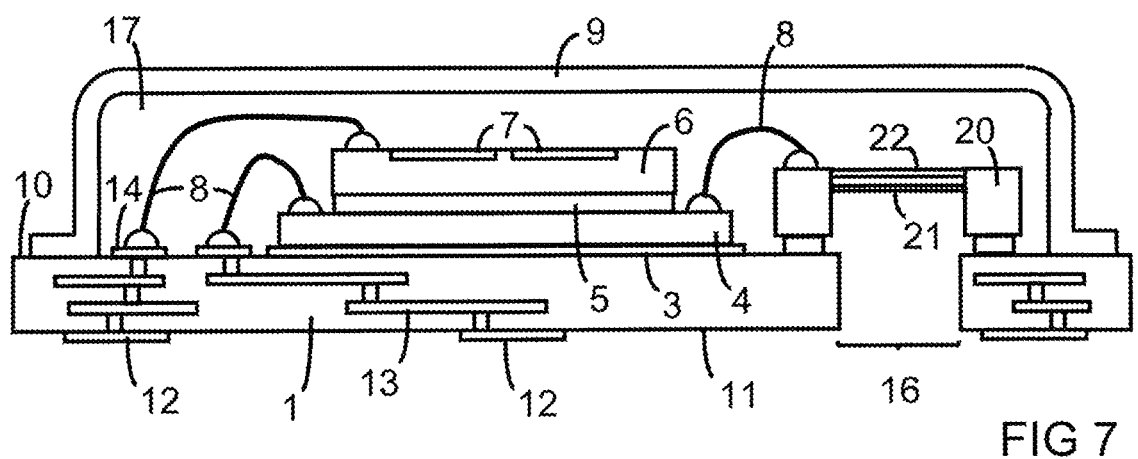
FIG. 7 is a cross section according to FIG. 1 for a further microphone and pressure sensor package with electric contacts on an upper surface of the bottom device.

FIG. 7 is a cross section according to FIG. 1 for a further microphone and pressure sensor package with electric contacts on an upper surface of the bottom device. Elements of the microphone and pressure sensor package according to FIG. 1 that are similar to corresponding elements of the microphone and pressure sensor package according to FIG. 7 are designated with the same reference numerals. In the microphone and pressure sensor package according to FIG. 7, at least one lateral dimension of the bottom device 4 is larger than the corresponding lateral dimension of the ASIC device 6. Therefore the upper surface of the bottom device 4 is not entirely covered by the ASIC device 6. Thus it is possible to apply electric connections 8, especially bond wires, on contact areas provided at the upper surface of the bottom device 4, as shown in FIG. 7. This is suitable if the bottom device 4 is a further ASIC device with integrated circuits.

In the example shown in FIG. 7, the bottom device 4 and the ASIC device 6 are electrically connected with contact pads 14 on the top surface 10 of the carrier 1, and the microphone device 20 is electrically connected with the bottom device 4, which is provided for the evaluation of signals from the microphone device 10. Electric connections may also be provided between the microphone device 20 and the ASIC device 6, between the microphone device 20 and contact pads 14 on the top surface 10 of the carrier 1, or between the bottom device 4 and the ASIC device 6. Hence the circuitry may be divided between the bottom device 4, the ASIC device 6 and the microphone device 20 in various ways.

Figure 8:
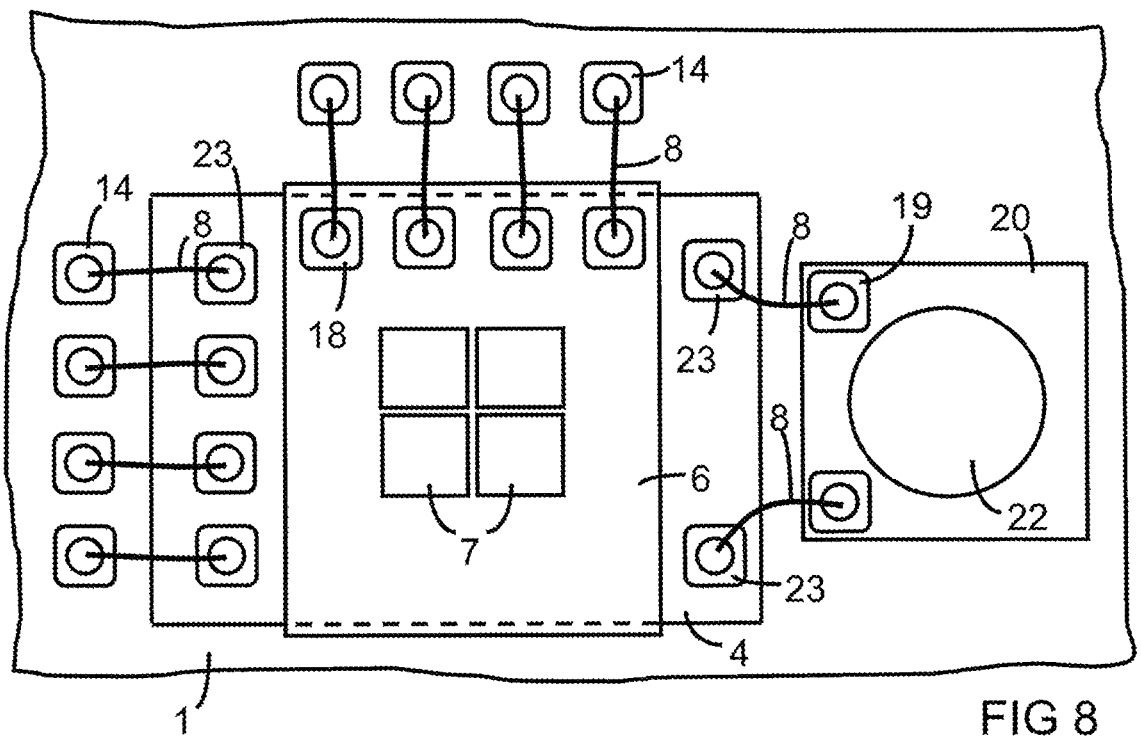
FIG. 8 is a top view of the interior parts of a microphone and pressure sensor package according to FIG. 7.

FIG. 8 is a top view of the interior parts of a microphone and pressure sensor package according to FIG. 7. The electric connections 8, which are bond wires in this example, are applied on contact pads 14 on the top surface 10 of the carrier 1, on contact areas 18 of the ASIC device 6, on further contact areas 19 of the microphone device 20, and on further contact areas 23 of the bottom device 4. The contact areas 18, 19, 23 may be contact pads or uncovered surface areas of an uppermost metallization level of a wiring, for instance. The number and the arrangement of the contact pads 14 and contact areas 18, 19, 23 can be varied according to individual requirements. The sensor element 7 or array of sensor elements 7 may be arranged at or near the center of the ASIC device 6, as shown in FIG. 8 by way of example, or near the periphery of the ASIC device 6.

Figure 9:
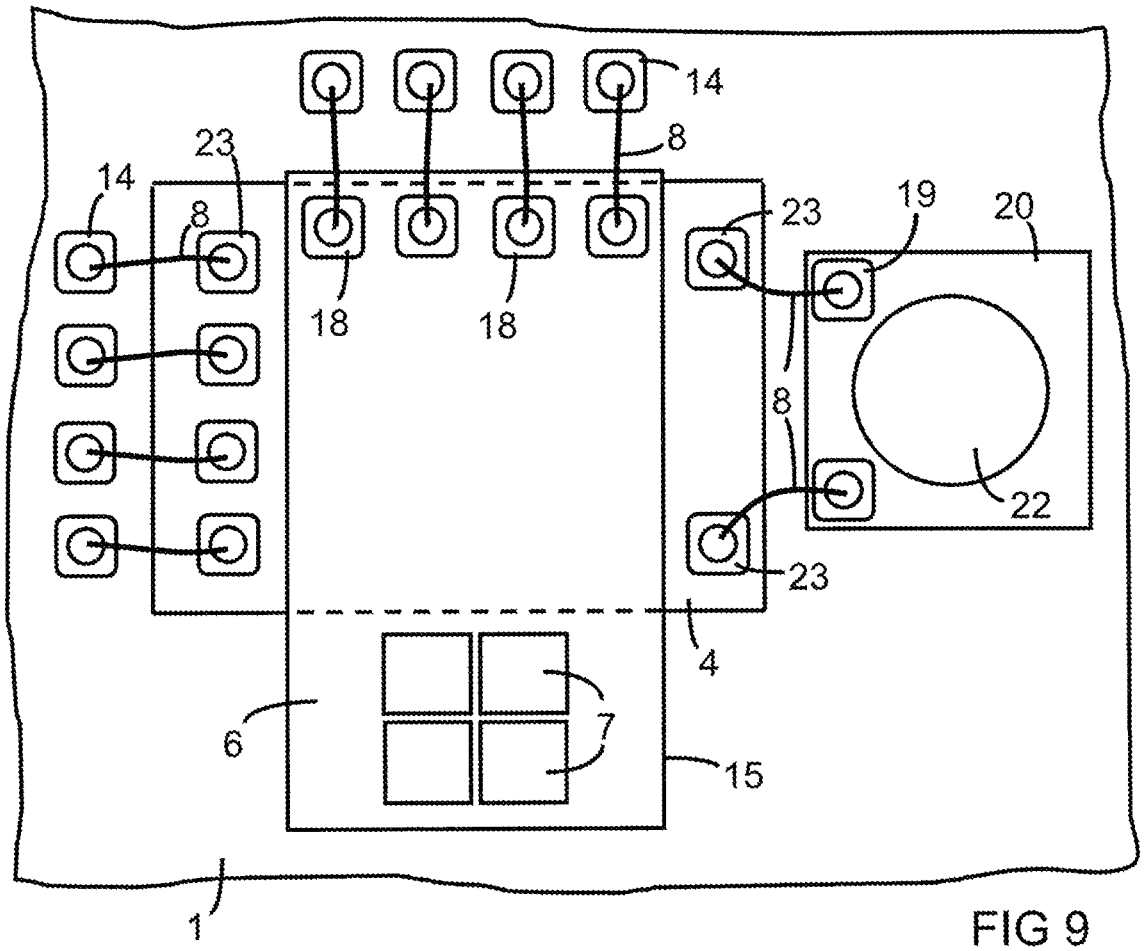
FIG. 9 is a top view of the interior parts of a further microphone and pressure sensor package according to FIG. 7.

FIG. 9 is a top view according to FIG. 8 for a further embodiment comprising a larger overhang 15 of the ASIC device 6. The sensor element 7 or array of sensor elements 7 may be arranged near the periphery of the ASIC device 6, as shown in FIG. 9, in order to enhance the mechanical decoupling from the bottom device 4 and the carrier 1.

The microphone and pressure sensor package can be produced by arranging a microphone device above an opening in a carrier, fastening an ASIC device with an integrated pressure sensor on the carrier, and applying a cover to the carrier, so that the cover forms a cavity between the carrier and the cover, the cavity accommodating the ASIC device and the microphone device. The ASIC device and the microphone device may be the only devices that are present in the microphone and pressure sensor package as two semiconductor dies or chips including active components.

The optional bottom device can be fastened using a die attach foil or flip-chip technology. An adhesive layer comprising silicone can be applied like a glue between the bottom device and the ASIC device. The carrier can be provided with electric conductors, contact pads and rear terminal contacts, and the devices can be electrically connected by bond wires with one another or with contact pads of the carrier.

A pressure sensor may thus be directly integrated on top of a CMOS read-out circuit. A capacitive pressure sensor has the advantage that the power consumption is five to ten times lower than in a piezo-resistive pressure sensor. Because of the direct integration on top of a CMOS device, parasitic coupling is absent. This is beneficial because it reduces sensitivity for electromagnetic interference and relative humidity and reduces the total capacitance.

This feature allows to place a single ASIC device inside the package with optional pressure, temperature and microphone read-out functionality. The integration of the pressure sensor on one single die increases the remaining volume of the cavity, and this increase of the void is also beneficial.

The microphone and pressure sensor package provides a compact combination of a microphone and a pressure sensor for improved performance. The microphone device can especially be a conventional microelectromechanical system. The integration of the pressure sensor in an ASIC device including an integrated circuit like a CMOS circuit for the operation of the pressure sensor and the evaluation of the signals obtained allows a reduction of the overall dimensions of the package. An enhanced mechanical decoupling of the pressure sensor from the carrier is achieved by the arrangement of the ASIC device with integrated pressure sensor on a stack including a bottom device, which may in particular be an electrically inactive dummy die or interposer. The pressure sensor can be arranged in an overhanging portion of the ASIC device for further reduction of stress.

The invention claimed is:

1. A microphone and pressure sensor package, comprising:
    a carrier with an opening;
    a microphone device including a diaphragm and a perforated back plate arranged above the opening;
    an application-specific integrated circuit (ASIC) device;
    a cover forming a cavity between the carrier and the cover, the ASIC device and the microphone device being arranged in the cavity; and
    a bottom device, the bottom device being fastened between the carrier and the ASIC device,
    wherein a sensor element provided for a pressure sensor is integrated in the ASIC device,
    wherein a portion of the ASIC device laterally overhangs the bottom device,
    wherein at least a portion of the sensor element is arranged in the portion of the ASIC device that laterally overhangs the bottom device, and
    wherein the microphone and pressure sensor are configured such that, during operation, a pressure that is present outside the cavity is transferred to the sensor element through the opening, the diaphragm, and the back plate.

2. The microphone and pressure sensor package according to claim 1, wherein the ASIC device is mounted on the carrier by an adhesive layer.

3. The microphone and pressure sensor package according to claim 1, wherein the bottom device comprises an insulator or glass.

4. The microphone and pressure sensor package according to claim 1, wherein the bottom device includes an electrically inactive semiconductor substrate.

5. The microphone and pressure sensor package according to claim 1, wherein the bottom device includes a further ASIC device, which is electrically connected with the microphone device.

6. The microphone and pressure sensor package according to claim 1, further comprising:
    an adhesive layer between the bottom device and the ASIC device, the adhesive layer comprising silicone.

7. The microphone and pressure sensor package according to claim 1, wherein the ASIC device laterally overhangs the bottom device by at least 100 μm.

8. The microphone and pressure sensor package according to claim 1, wherein the ASIC device is electrically connected with the microphone device.

9. The microphone and pressure sensor package according to claim 8, wherein the ASIC device is provided for a read-out of the sensor element and the microphone device.

10. The microphone and pressure sensor package according to claim 1, further comprising:
    electric conductors arranged in the carrier, the ASIC device being electrically connected with the electric conductors.

11. The microphone and pressure sensor package according to claim 10, wherein
    the microphone device is electrically connected with the electric conductors.

12. The microphone and pressure sensor package according to claim 10, wherein the ASIC device is mounted to the carrier in a flip-chip technology.

13. The microphone and pressure sensor package according to claim 1, further comprising:
    a hole or a plurality of holes penetrating the diaphragm.

14. A method of producing a microphone and pressure sensor package, comprising:
    providing a carrier with an opening;
    arranging a microphone device including a diaphragm and a perforated back plate above the opening;
    providing an application-specific integrated circuit (ASIC) device with an integrated sensor element provided for a pressure sensor;
    fastening a bottom device onto the carrier;
    fastening the ASIC device onto the bottom device such that the bottom device is disposed between the carrier and the ASIC device, a portion of the ASIC device overhangs the bottom device, and at least a portion of the sensor element is arranged in the portion of the ASIC device that overhangs the bottom device;
applying a cover to the carrier, the cover forming a cavity between the carrier and the cover, the ASIC device and the microphone device being arranged in the cavity.

15. The method according to claim 14, further comprising:
arranging an adhesive layer comprising silicone between the bottom device and the ASIC device.

16. The method according to claim 14, further comprising:
providing the carrier with electric conductors, and
electrically connecting at least one device selected from the group consisting of the microphone device, the bottom device and the ASIC device with the electric conductors.

17. The method according to claim 14, further comprising:
forming electric connections comprising bond wires, the electric connections electrically connecting at least one device selected from the group consisting of the microphone device, the bottom device and the ASIC device.

18. The method according to claim 14, further comprising:
providing the diaphragm with a hole or a plurality of holes penetrating the diaphragm.

19. A method of producing a microphone and pressure sensor package, comprising:
providing a carrier with an opening;
arranging a microphone device including a diaphragm and a perforated back plate above the opening;
providing an application-specific integrated circuit (ASIC) device with an integrated sensor element provided for a pressure sensor;
providing a bottom device selected from the group consisting of an insulator, glass, an electrically inactive semiconductor substrate and a further ASIC device electrically connected with the microphone device;
fastening the bottom device onto the carrier;
fastening the ASIC device onto the carrier such that the bottom device is disposed between the carrier and the ASIC device, a portion of the ASIC device overhangs the bottom device, and at least a portion of the sensor element is arranged in the portion of the ASIC device that overhangs the bottom device; and
applying a cover to the carrier, the cover forming a cavity between the carrier and the cover, the ASIC device and the microphone device being arranged in the cavity.

* * * * *